(12) United States Patent
Tomita (10) Patent No.: US 7,545,699 B2
(45) Date of Patent: Jun. 9, 2009

(54) SEMICONDUCTOR MEMORY DEVICE WITH PARTIAL REFRESH FUNCTION

(75) Inventor: Hiroyoshi Tomita, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 111 days.

(21) Appl. No.: 11/892,497

(22) Filed: Aug. 23, 2007

(65) Prior Publication Data
US 2008/0080286 A1  Apr. 3, 2008

(30) Foreign Application Priority Data
Sep. 29, 2006  (JP)  ............. 2006-269629

(51) Int. Cl.
*G11C 7/00* (2006.01)
(52) U.S. Cl. .............. 365/222; 265/189.04
(58) Field of Classification Search .......... 365/222, 365/189.04, 201
See application file for complete search history.

(56) References Cited

U.S. PATENT DOCUMENTS 5,890,198 A * 3/1999 Pawlowski ............. 711/106
6,903,990 B2 * 6/2005 Mizugaki ............... 365/222
6,917,553 B2 * 7/2005 Mizugaki et al. ........ 365/222
7,006,401 B2 * 2/2006 Takahashi et al. ....... 365/222

FOREIGN PATENT DOCUMENTS

JP  2004-227624  8/2004
WO  WO 2004/070729 A1  8/2004

\* cited by examiner

*Primary Examiner*—Anh Phung
(74) *Attorney, Agent, or Firm*—Arent Fox LLP (57) ABSTRACT

A semiconductor memory device includes a timing signal circuit to generate a refresh timing signal comprised of a series of pulses, a refresh address circuit to generate a refresh address in synchronization with each pulse of the refresh timing signal, a pulse selecting circuit to assert a refresh request signal in synchronization with pulses selected from the series of pulses, and a memory core to receive the refresh address and the refresh request signal and to perform a refresh operation with respect to the refresh address in response to assertion of the refresh request signal, wherein arrangement is made to switch between a first operation mode in which the selected pulses are obtained by selecting one pulse out of every predetermined number of pulses from the series of pulses and a second operation mode in which the selected pulses are obtained by selecting consecutive pulses from the series of pulses.

10 Claims, 10 Drawing Sheets

SEMICONDUCTOR MEMORY DEVICE WITH PARTIAL REFRESH FUNCTION

CROSS-REFERENCE TO RELATED APPLICATIONS

The present application is based upon and claims the benefit of priority from the prior Japanese Patent Application No. 2006-269629 filed on Sep. 29, 2006, with the Japanese Patent Office, the entire contents of which are incorporated herein by reference.

BACKGROUND OF THE INVENTION

1. Field of the Invention

The present invention generally relates to semiconductor memory devices and memory systems, and particularly relates to a semiconductor memory device and memory system in which refresh can be performed with respect to part of the memory area.

2. Description of the Related Art

In portable terminals such as portable phones, SRAM (Static Random Access Memory) has conventionally been used. In recent years, there has been a trend to use DRAM (Dynamic Random Access Memory) for the purpose of providing a large memory capacity. With such configuration, the operating time of the battery becomes a problem.

SRAM consumes almost no electric power for the purpose of data retention. DRAM, on the other hand, stores data in memory capacitors, and requires that a refresh be periodically performed in order to retain the data. In DRAM used in potable equipment, generally, automatic refresh is internally performed based on a self-refresh function. The DRAM refresh operation includes reading cell data by successively activating word selecting lines, amplifying the data voltage by use of sense amplifiers, and restoring the amplified data to the cells. As a result, each refresh operation ends up consuming electric currents. DRAM thus consumes some electric power even in the standby mode. Namely, the retention of data in memory consumes electric power even when the portable equipment is not being used, thereby shortening the usable time of the battery.

In consideration of this, the self-refresh function of DRAM embedded in portable equipment is provided with a partial refresh function. The partial refresh function serves to perform a refresh operation only with respect to a portion of the DRAM memory area that requires refresh for the retention of data. When portable equipment shifts from the active mode to the standby mode, for example, the memory area used as a work area during the active mode does not need to retain data in the standby mode. It is thus possible to eliminate the refresh operation for such memory area.

Figure 1:
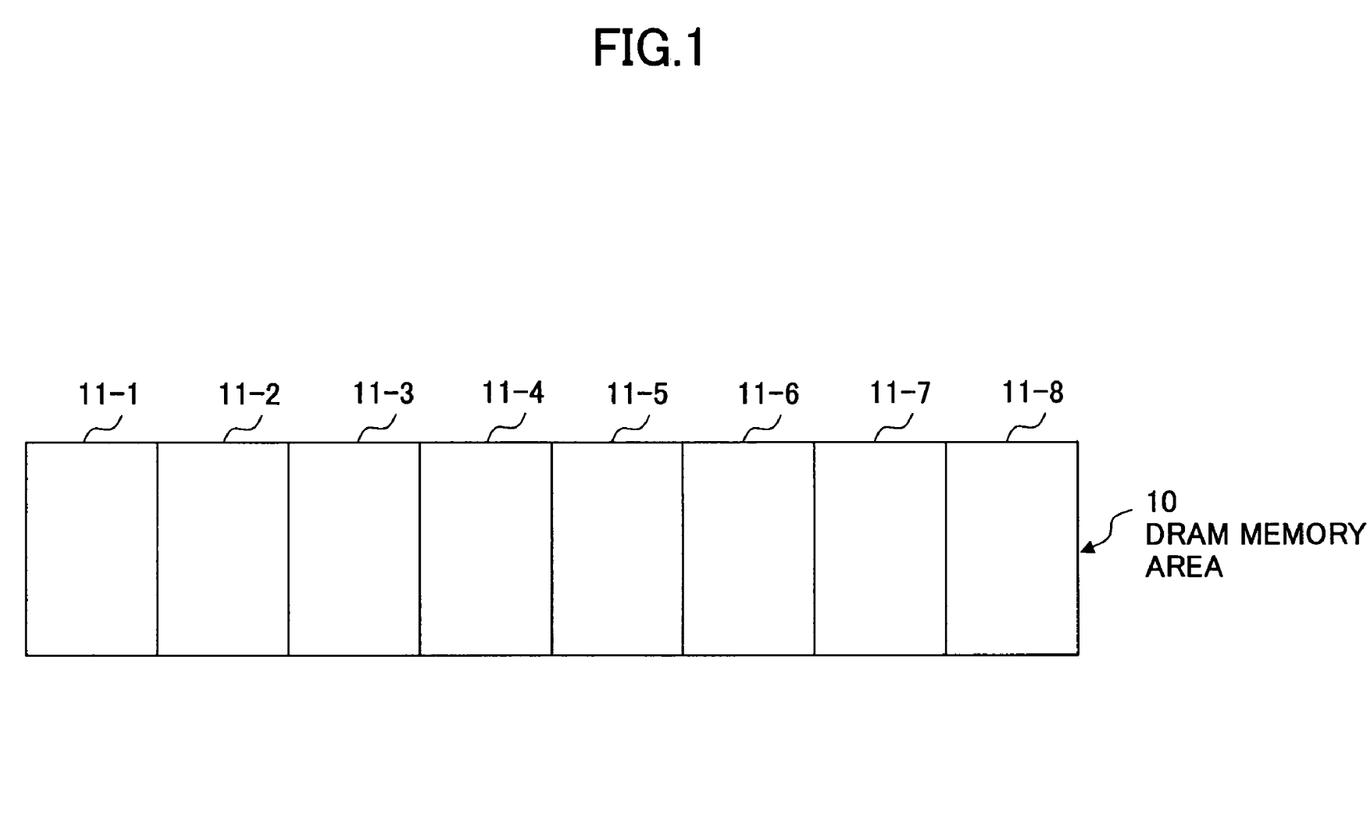
FIG. 1 is a drawing illustrating a DRAM memory area.

FIG. 1 is a drawing illustrating a DRAM memory area. In FIG. 1, a DRAM memory area 10 includes 8 blocks 11-1 through 11-8, for example. For the sake of simplicity of explanation, it is assumed that the memory array of each block includes 8 word lines. Depending on the circumstances, the partial refresh function may perform the refresh operation only with respect to only one block 11-1, for example, or may perform the refresh operation only with respect to two blocks 11-1 and 11-2.

Figure 2:
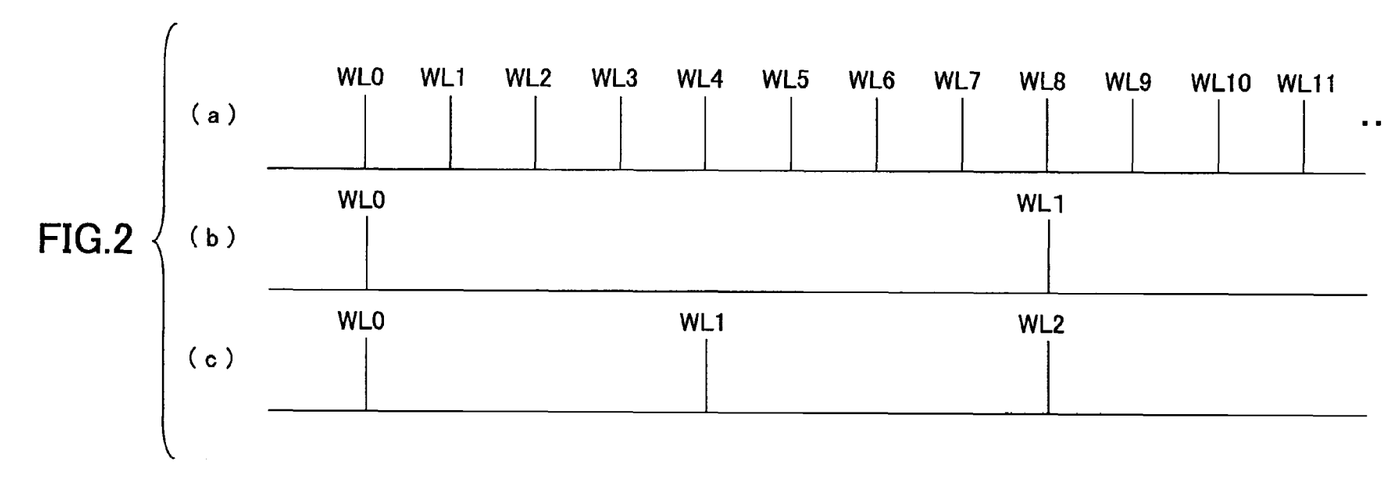
FIG. 2 is a drawing for explaining a partial refresh operation.

FIG. 2 is a drawing for explaining the partial refresh operation. FIG. 2-(a) shows word lines subjected to successive refreshes when the entirety of the DRAM memory area 10 is refreshed. Word lines WL0 through WL7 are the eight word lines of the block 11-1, for example, and word lines WL8 through WL15 (illustrated up to WL11) are the eight word lines of the block 11-2. In the same manner, each one of the blocks 11-3 through 11-8 is provided with eight word lines.

When the entirety of the DRAM memory area 10 is refreshed as shown in FIG. 2-(a), the eight word lines WL0 through WL7 of the block 11-1 are successively activated and subjected to refresh operation, followed by the word lines WL8 through WL15 of the block 11-2 being successively activated and subjected to refresh operation. Thereafter, the blocks 11-3 through 11-8 are successively subjected to refresh operation, followed by the block 11-1 being refreshed again for the next round of refresh operation.

FIG. 2-(b) shows the word lines subjected to successive refreshes when only the block 11-1 of the DRAM memory area 10 is refreshed. The word line WL0 of the block 11-1 is refreshed first, and, then, the next word line. WL1 of the same block 11-1 is refreshed after an interval that is longer than in the case of (a). Thereafter, the word lines WL2 through WL7 of the block 11-1 are refreshed in the same manner, followed by the word line WL0 being refreshed again for the next round of refresh operation. In the case of (b), the number of word lines subjected to refresh is ⅛ of the total number of word lines of the DRAM memory area 10, so that the refresh interval can be set ⅛ as frequent as the interval used in the case of (a). With such setting, the time length from the refreshing of the word line WL0 to the next refreshing of the same word line WL0 is the same between the case (a) and the case (b).

FIG. 2-(c) shows the word lines subjected to successive refreshes when only the blocks 11-1 and 11-2 of the DRAM memory area 10 are refreshed. The word line WL0 of the block 11-1 is refreshed first, and, then, the next word line WL1 of the same block 11-1 is refreshed after an interval that is longer than in the case of (a) but shorter than in the case of (b). Thereafter, the word lines WL2 through WL7 of the block 11-1 are refreshed in the same manner, and, then, the word lines WL8 through WL15 of the block 11-2 are refreshed. After this, the word line WL0 of the block 11-1 is refreshed again for the next round of refresh operation. In the case of (c), the number of word lines subjected to refresh is ¼ of the total number of word lines of the DRAM memory area 10, so that the refresh interval can be set ¼ as frequent as the interval used in the case of (a). With such setting, the time length from the refreshing of the word line WL0 to the next refreshing of the same word line WL0 is the same between the case (a) and the case (c).

With the arrangement as shown in FIG. 2, it is possible to achieve the partial refresh function. This arrangement, however, gives rise to a problem as follows when a transition occurs from the ⅛ partial refresh operation (FIG. 2-(b)) to the ¼ partial refresh operation (FIG. 2-(c)).

In the ⅛ partial refresh operation, adjacent word lines are refreshed at time interval T, for example, and the same word line is refreshed at time interval 8T. There may be a case in which a transition occurs from the ⅛ partial refresh operation (FIG. 2-(b)) to the ¼ partial refresh operation (FIG. 2-(c)) upon refreshing the word lines WL0 through WL6, for example. The next word line to be refreshed is WL7, so that the word line WL7 is refreshed, followed by refreshing the word lines WL8 through WL15 in the order of address. In this case, more than 8T ends up passing before the word line WL0 is refreshed again. Namely, the data of the memory cells corresponding to the word line WL0 are not refreshed within the time period necessary to retain data, so that the data may end up being lost.

In order to avoid this problem, there is a need to perform a refresh operation at an interval shorter than normal refresh interval T/2 corresponding to the ¼ partial refresh operation after the transition to the ¼ partial refresh operation (FIG. 2-(c)). With such behavior, high-speed refresh operation (i.e., refreshes at short intervals) is necessary each time the refresh area is changed. This causes an increase in electric current consumption.

[Patent Document 1] International Publication No. WO04/070729

Accordingly, there is a need for a semiconductor memory device provided with a partial refresh function that can reliably retain data through refresh operation without causing an increase in electric current consumption.

SUMMARY OF THE INVENTION

It is a general object to provide a semiconductor memory device that substantially obviates one or more problems caused by the limitations and disadvantages of the related art.

Features and advantages will be presented in the description which follows, and in part will become apparent from the description and the accompanying drawings, or may be learned by practice according to the teachings provided in the description. Objects as well as other features and advantages will be realized and attained by a semiconductor memory device particularly pointed out in the specification in such full, clear, concise, and exact terms as to enable a person having ordinary skill in the art.

To achieve these and other advantages, a ordinary skill in the art to practice the invention.

To achieve these and other advantages in accordance with the purpose of the invention, the invention provides a semiconductor memory device, which includes a timing signal generating circuit configured to generate a refresh timing signal comprised of a series of pulses arranged at constant intervals, a refresh address generating circuit configured to generate a refresh address in synchronization with each pulse of the refresh timing signal, a pulse selecting circuit configured to assert a refresh request signal in synchronization with selected pulses selected from the series of pulses of the refresh timing signal, and a memory core circuit configured to receive the refresh address and the refresh request signal and to perform a refresh operation with respect to the refresh address in response to assertion of the refresh request signal, wherein arrangement is made to switch between a first operation mode in which the selected pulses are obtained by selecting one pulse out of every predetermined number of pulses from the series of pulses and a second operation mode in which the selected pulses are obtained by selecting consecutive pulses from the series of pulses.

According to another aspect of the present invention, a memory system includes a memory, a power supply voltage detecting circuit configured to detect a voltage level of a power supply voltage of the memory, and a controller configured to control the memory in response to the voltage level detected by the power supply voltage detecting circuit, wherein the memory includes a timing signal generating circuit configured to generate a refresh timing signal comprised of a series of pulses arranged at constant intervals, a refresh address generating circuit configured to generate a refresh address in synchronization with each pulse of the refresh timing signal, a pulse selecting circuit configured to assert a refresh request signal in synchronization with selected pulses selected from the series of pulses of the refresh timing signal, and a memory core circuit configured to receive the refresh address and the refresh request signal and to perform a refresh operation with respect to the refresh address in response to assertion of the refresh request signal, wherein arrangement is made to switch between a first operation mode in which the selected pulses are obtained by selecting one pulse out of every predetermined number of pulses from the series of pulses and a second operation mode in which the selected pulses are obtained by selecting consecutive pulses from the series of pulses, and the memory controller is configured to select one of the first operation mode and the second operation mode in response to the detected voltage level and to cause the memory to operate in the selected operation mode.

According to at least one embodiment of the present invention, the frequency of the refresh timing signal is set to a sufficiently high frequency that is necessary to retain the data of all the addresses when all the refresh addresses are sequentially refreshed one by one. Regardless of whether in the case of the first operation mode in which refresh is performed intermittently by skipping the pulses of the refresh timing signal at predetermined intervals, or in the case of the second operation mode in which refresh is continuously performed with respect to consecutive addresses without refreshing other addresses, a refresh address of interest is always refreshed at constant time intervals that are determined by the frequency of the refresh timing signal. Accordingly, no matter how the area subjected to refresh is changed, a refresh operation is never delayed with respect to a given refresh address

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 3:
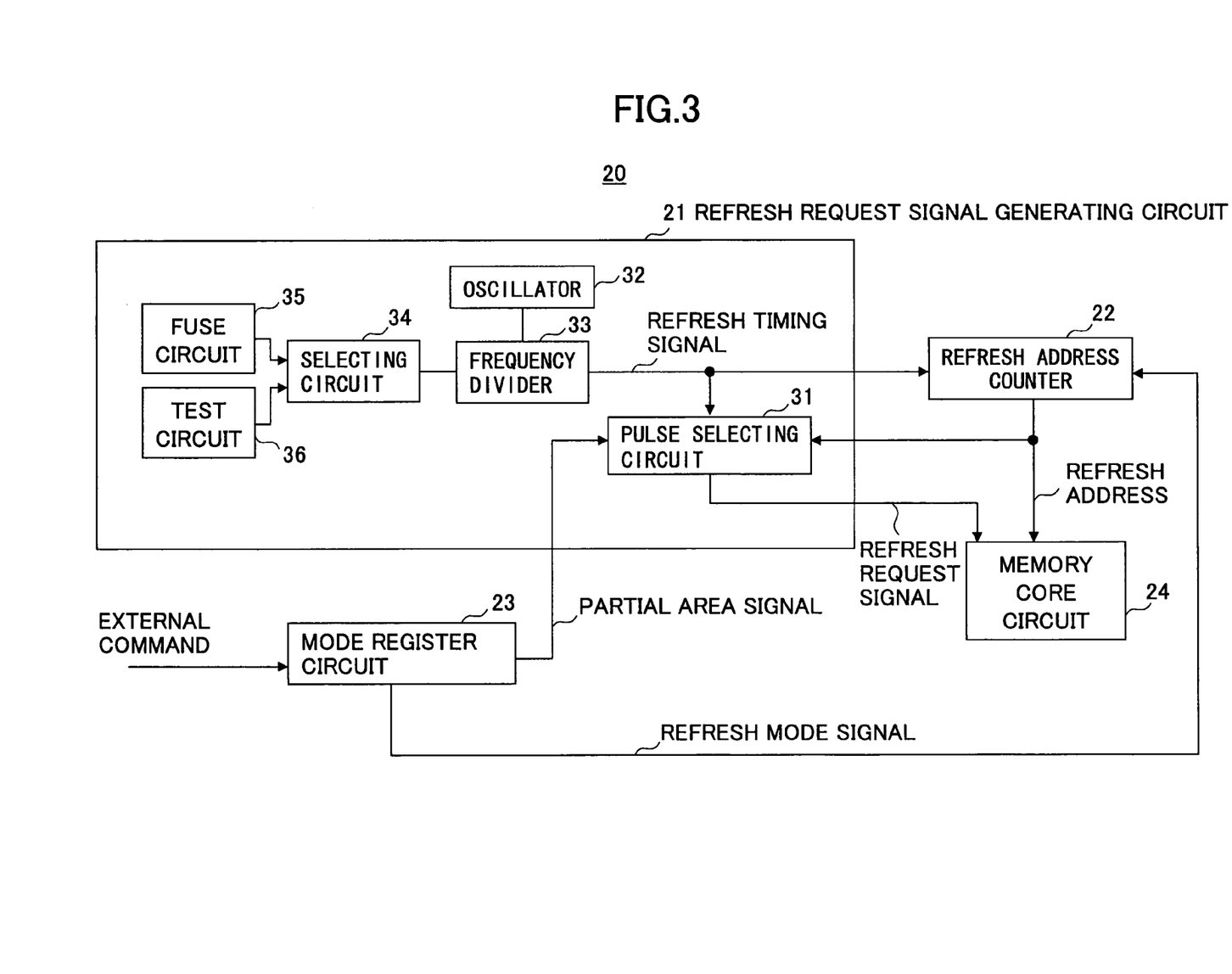
FIG. 3 is a drawing showing an example of the configuration of a semiconductor memory device according to the present invention.

FIG. 3 is a drawing showing an example of the configuration of a semiconductor memory device according to the present invention; A semiconductor memory device 20 of FIG. 3 includes a refresh request signal generating circuit 21, a refresh address counter 22, a mode register circuit 23, and a memory core circuit 24.

The memory core circuit 24 includes a memory array, a row decoder, a column decoder, etc. The column decoder decodes a column address supplied from an external source, and activates a column selecting line specified by the column address. The row decoder decodes a row address supplied from an external source at the time of routine read/write operation, and activates a word line specified by the row address. Further, the row decoder decodes a refresh address supplied from the refresh address counter 22 at the time of refresh operation, and activates a word line specified by the refresh address.

Data stored in memory cells (memory capacitors) connected to an activated word line are read to bit lines and amplified by sense amplifiers. In the case of read operation, the data amplified by the sense amplifiers is subjected to selection by an activated column selecting line, and the selected data is output to an exterior of the semiconductor memory device. In the case of write operation, write data is supplied from an external source outside the semiconductor memory device, and is written to sense amplifiers at the column address selected by an activated column selecting line. This write data and the data that were read from memory cells and ought to be restored are written to the memory cells connected to an activated word line. In the case of refresh operation, the data that were read from memory cells and amplified by the sense amplifiers are written as restore data to the memory cells connected to an activated word line.

The refresh address counter 22 performs count-up operations in synchronization with a refresh timing signal supplied from the refresh request signal generating circuit 21, thereby generating refresh addresses indicative of addresses to be refreshed. The refresh address generated by the refresh address counter 22 is supplied to the memory core circuit 24 and the refresh request signal generating circuit 21. As will later be described, the refresh address counter 22 can switch the advance patterns of generated refresh addresses in response to a refresh mode signal supplied from the mode register circuit 23.

The refresh request signal generating circuit 21 generates the refresh timing signal as a pulse signal indicative of predetermined refresh timing. The refresh request signal generating circuit 21 further generates a refresh request signal in response to the refresh timing signal generated internally, the refresh address supplied from the refresh address counter 22, and a partial area signal supplied from the mode register circuit 23. The refresh request signal is placed in the asserting state when the current refresh address indicated by the refresh address counter 22 is one of the addresses subjected to refresh. The refresh request signal is placed in the negating state when the current refresh address indicated by the refresh address counter 22 is not one of the addresses subjected to refresh. The generated refresh request signal is supplied to the memory core circuit 24.

In the memory core circuit 24, a word line specified by the refresh address supplied from the refresh address counter 22 is activated and subjected to refresh operation if the refresh request signal supplied from the refresh request signal generating circuit 21 is in the asserting state. No refresh is performed with respect to the refresh address supplied from the refresh address counter 22 if the refresh request signal supplied from the refresh request signal generating circuit 21 is in the negating state.

The mode register circuit 23 stores various mode settings in its internal registers in response to a mode setting command supplied from an external source. The mode settings include a setting corresponding to the partial area signal and a setting corresponding to the refresh mode signal. The partial area signal serves to specify a memory area that is subjected to refresh operation. The refresh mode signal serves to select an address advance pattern from a plurality of refresh address advance patterns.

The refresh request signal generating circuit 21 includes a pulse selecting circuit 31, an oscillator 32, a frequency divider 33, a selecting circuit 34, a fuse circuit 35, and a test circuit 36. The oscillator 32 generates a pulse signal having a predetermined cycle by use of an inverter loop, for example. The oscillating signal generated by the oscillator 32 is supplied to the frequency divider 33. The frequency divider 33 divides the frequency of the oscillating signal supplied from the oscillator 32 according to the frequency division ratio selected by the selecting circuit 34. The frequency divider 33 may use a plurality of halving frequency division circuit to generate frequency-divided signals corresponding to ½ of the frequency, ¼ of the frequency, ⅛ of the frequency, and so on, and the selecting circuit 34 may select and output one of the frequency-divided signals corresponding to the selected frequency division ratio. The frequency-divided signal output from the frequency divider 33 is supplied to the refresh address counter 22 and the pulse selecting circuit 31 as the refresh timing signal. Namely, the frequency divider 33 serves as a timing signal generating circuit for generating the refresh timing signal.

Selection of a frequency division ratio by the selecting circuit 34 is performed by selecting one of the outputs of the fuse circuit 35 and the test circuit 36. The fuse circuit 35 outputs a signal indicative of a predetermined frequency division ratio in response to the cut/intact state of internal fuses. The test circuit 36 outputs a signal indicative of a frequency division ratio used in test operation. The selecting circuit 34 selects one of the output signal of the fuse circuit 35 and the output signal of the test circuit 36 for provision to the frequency divider 33 as a signal indicative of a frequency division ratio.

Figure 4:
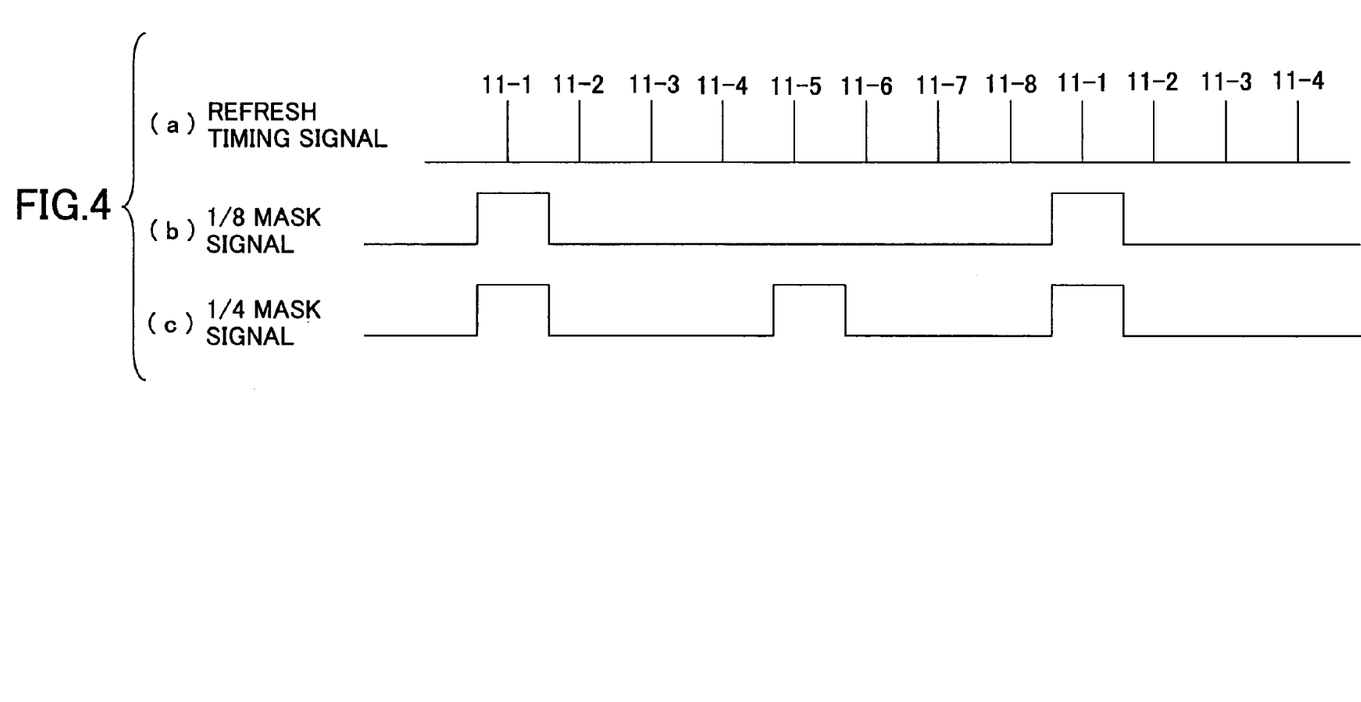
FIG. 4 is a drawing for explaining a first operation of a pulse selecting circuit shown in FIG. 3.

FIG. 4 is a drawing for explaining a first operation of the pulse selecting circuit 31 shown in FIG. 3. In FIG. 4, (a) shows the refresh timing signal generated by the frequency divider 33. The pulse cycle of this refresh timing signal is constant without a change. A number shown above each pulse of the refresh timing signal in FIG. 4-(a) indicates the block to which the refresh address generated by the refresh address counter 22 in response to each pulse belongs, and these numbers correspond to the blocks 11-1 through 11-8 of the DRAM memory area 10 shown in FIG. 1, for example. The pulse selecting circuit 31 generates a mask signal by checking whether the refresh address indicated by the refresh address counter 22 is one of the addresses subjected to refresh, thereby masking the refresh timing signal by use of the mask signal when the refresh address is not one of the addresses subjected to refresh.

FIG. 4-(b) shows a mask signal used in a ⅛ partial refresh operation that refreshes only the block 11-1 in the DRAM memory area 10 shown in FIG. 1, for example. As shown in FIG. 4-(b), the mask signal used in the ⅛ partial refresh operation is comprised of a LOW signal level during the period corresponding to 7 pulses of the 8 pulses of the refresh timing signal and a HIGH level signal at the timing corresponding to the 1 remaining pulse. Obtaining a logic product of this mask signal and the refresh timing signal can let one pulse to pass in every 8 pulses and mask the remaining pulses. The pulse signal generated in this manner is supplied to the memory core circuit 24 as the refresh request signal.

FIG. 4-(c) shows a mask signal used in a ¼ partial refresh operation that refreshes only the blocks 11-1 and 11-5 in the DRAM memory area 10 shown in FIG. 1, for example. As shown in FIG. 4-(c), the mask signal used in the ¼ partial refresh operation is comprised of a LOW signal level during the period corresponding to 3 pulses of the 4 pulses of the refresh timing signal and a HIGH level signal at the timing corresponding to the 1 remaining pulse. Obtaining a logic product of this mask signal and the refresh timing signal can cause one pulse to pass in every 4 pulses and mask the remaining pulses. The pulse signal generated in this manner is supplied to the memory core circuit 24 as the refresh request signal.

In the operations described above, the refresh addresses should be produced in accordance with an address advance pattern in which refresh addresses increase in increments of one block rather than in increments of one address. Here, the term "block" refers to a portion of a memory array that corresponds to the plurality of word lines such that a selective activation of any one of these word lines results in a selective activation of the same sense amplifiers.

In the case of an address advance pattern in which addresses increase in increments of one block, the addresses of the plurality of word lines in the block 11-1 are not successively selected, followed by advancing to the next block 11-2 after the selecting of all the word line addresses in FIG. 1. Instead, the selecting of the first word line in the block 11-1 is followed by the selecting of the first word line in the next block 11-2, further followed by the selecting of the first word line in successive ones of the blocks 11-3 through 11-8. The block 11-1 is then visited again for the selecting of the second word line in successive ones of the blocks 11-1 through 11-8. Addresses are thereafter advanced in the same manner, and the address of the first word line of the block 11-1 is visited again upon completing the selecting of the last word line address in each one of the blocks. The generation of such address advance pattern will later be described in detail.

The selecting of one pulse in every 8 pulses of the refresh timing signal as shown in FIG. 4-(*b*), for example, with the address advance pattern as described above results in only the block 11-1 being refreshed in the DRAM memory area 10 of FIG. 1. The selecting of one pulse in every 4 pulses of the refresh timing signal as shown in FIG. 4-(*c*), for example, results in only the blocks 11-1 and 11-5 being refreshed in the DRAM memory area 10 of FIG. 1.

Although in the description given above, the portion to be refreshed by the partial refresh operation was assumed to be a block area that is ⅛ or ¼ as large as the entirety of the DRAM memory area 10, the present invention is not limited to these particular configurations. The area to be refreshed may be of any size. Provision may be made such that a partial refresh operation is performed with respect to an area that is ½ as large, 1/16 as large, 1/32 as large, etc. The intervals between the HIGH pulses of the mask signal do not have to be constant. In FIG. 4-(*c*), for example, provision may be made such that the mask signal becomes HIGH at such position as to select the block 11-2 instead of the block 11-5.

Figure 5:
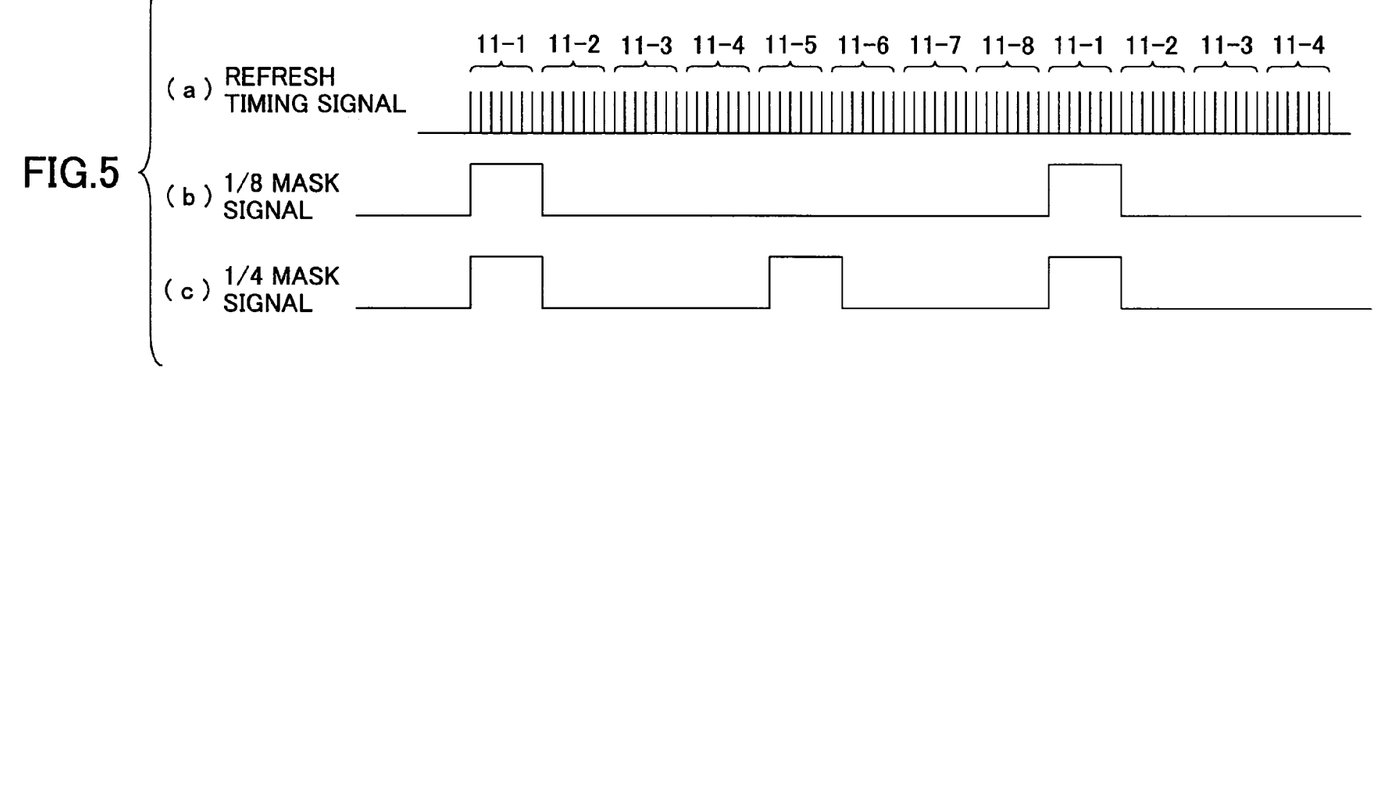
FIG. 5 is a drawing for explaining a second operation of the pulse selecting circuit shown in FIG. 3.

FIG. 5 is a drawing for explaining a second operation of the pulse selecting circuit 31 shown in FIG. 3. In FIG. 5, (*a*) shows the refresh timing signal generated by the frequency divider 33. The pulse cycle of this refresh timing signal is constant without a change. A number shown above each pulse of the refresh timing signal in FIG. 4-(*a*) indicates the block to which the refresh address generated by the refresh address counter 22 in response to each pulse belongs, and these numbers correspond to the blocks 11-1 through 11-8 of the DRAM memory area 10 shown in FIG. 1, for example. The pulse selecting circuit 31 generates a mask signal by checking whether the refresh address indicated by the refresh address counter 22 is one of the addresses subjected to refresh, thereby masking the refresh timing signal by use of the mask signal when the refresh address is not one of the addresses subjected to refresh.

FIG. 5-(*b*) shows a mask signal used in a ⅛ partial refresh operation that refreshes only the block 11-1 in the DRAM memory area 10 shown in FIG. 1, for example. As shown in FIG. 5-(*b*), the mask signal used in the ⅛ partial refresh operation is comprised of a HIGH signal level at the pulse timing corresponding to the block 11-1 among a series of pulses of the refresh timing signal and a LOW level signal at the pulse timing corresponding to the remaining pulses. Obtaining a logic product of this mask signal and the refresh timing signal can cause the pulses corresponding to one block to pass while masking the pulses corresponding to the 7 remaining blocks. The pulse signal generated in this manner is supplied to the memory core circuit 24 as the refresh request signal.

FIG. 5-(*c*) shows a mask signal used in a ¼ partial refresh operation that refreshes only the blocks 11-1 and 11-5 in the DRAM memory area 10 shown in FIG. 1, for example. As shown in FIG. 4-(*b*), the mask signal used in the ¼ partial refresh operation is comprised of a HIGH signal level at the pulse timing corresponding to the blocks 11-1 and 11-5 among a series of pulses of the refresh timing signal and a LOW level signal at the pulse timing corresponding to the remaining pulses. Obtaining a logic product of this mask signal and the refresh timing signal can cause the pulses corresponding to two blocks to pass while masking the pulses corresponding to the 6 remaining blocks. The pulse signal generated in this manner is supplied to the memory core circuit 24 as the refresh request signal.

In the operations described above, the refresh addresses are generated in accordance with the address advance pattern in which the addresses increase in increments of one address. Namely, the address advance pattern is configured in FIG. 1, for example, such that the plurality of word lines in the block 11-1 are successively selected by selecting an adjacent word line in the block 11-1 after selecting a given word line in the block 11-1, followed by advancing to the next block 11-2 after completing the selecting of all the word lines in the block 11-1.

In the present invention, the first operation shown in FIG. 4 and the second operation shown in FIG. 5 are switched in response to the refresh mode signal output from the mode register circuit 23. Such switching operation is implemented by switching address advance patterns. The switching of address advance patterns will later be described in detail.

Figure 6:
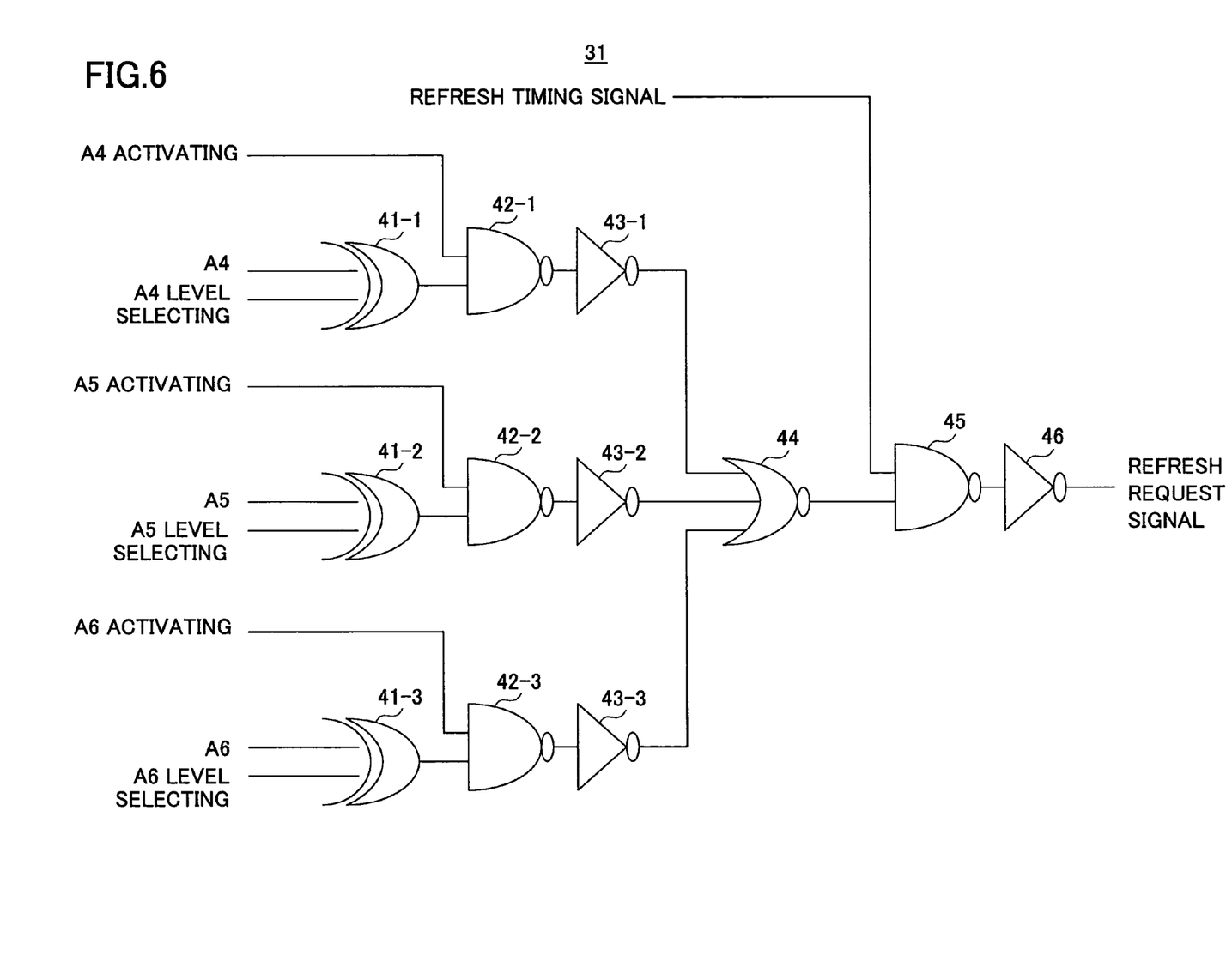
FIG. 6 is a drawing showing an example of the circuit configuration of the pulse selecting circuit.

FIG. 6 is a drawing showing an example of the circuit configuration of the pulse selecting circuit 31. The pulse selecting circuit 31 of FIG. 6 includes XOR (exclusive-OR) gates 41-1 through 41-3, NAND gates 42-1 through 42-3, inverters 43-1 through 43-3, a NOR gate 44, a NAND gate 45, and an inverter 46.

Figure 7:
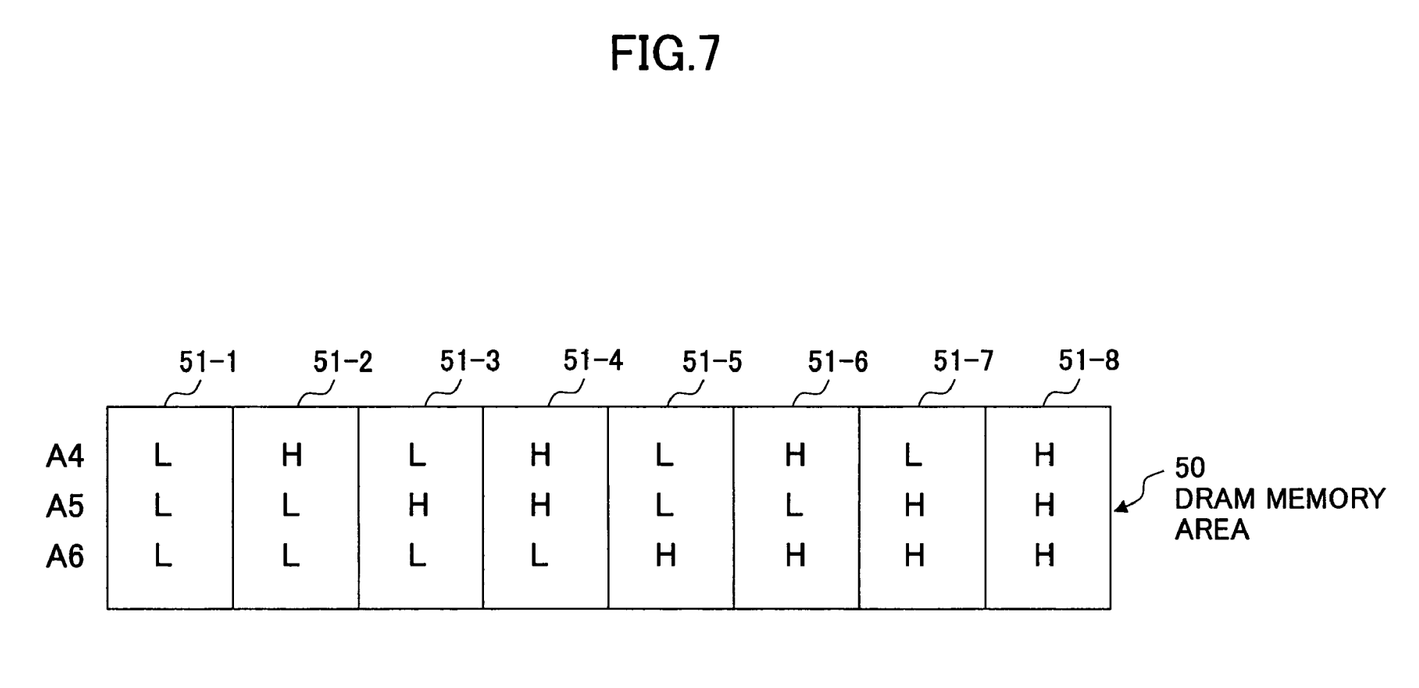
FIG. 7 is a drawing showing memory areas in which refresh operation is performed in response to pulse selections by the pulse selecting circuit shown in FIG. 6.

FIG. 7 is a drawing showing memory areas in which refresh operation is performed in response to pulse selections by the pulse selecting circuit 31 shown in FIG. 6. A DRAM memory area 50 is comprised of 8 blocks 51-1 through 51-8. The memory array of each block includes 16 word lines in this example. In total, 128 addresses (128 word lines) to be refreshed are in existence. In this case, 7 bits A0 through A6 can represent each refresh address in the DRAM memory area 50. A0 is the least significant bit, and A6 is the most significant bit.

The 8 blocks 51-1 through 51-8 of the DRAM memory area 50 can be represented by use of the three upper-order bits A4 through A6 of the refresh address. Namely, the block 51-1 corresponds to (A6, A5, A4)=(L, L, L), and the block 51-2 corresponds to (A6, A5, A4)=(L, L, H), for example. The 16 refresh addresses within the block 51-1, for example, have the three upper-order bits A4 through A6 equal to (L, L, L), and the bit pattern of the four lower-order bits represents one word line among the 16 word lines.

In the pulse selecting circuit 31 shown in FIG. 6, the three upper-order bits A4 through A6 of the refresh address generated by the refresh address counter 22 are supplied to one input of the XOR gates 41-1 through 41-3, respectively. The other input of the XOR gates 41-1 through 41-3 receives an A4 level selecting signal, an A5 level selecting signal, and an A6 level selecting signal, respectively.

The outputs of the XOR gates 41-1 through 41-3 are supplied to one input of the NAND gates 42-1 through 42-3, respectively. The other input of the NAND gates 42-1 through 42-3 receives an A4 activating signal, an A5 activating signal, and an A6 activating signal, respectively. The A4 through A6 level selecting signals and the A4 through A6 activating signals are the partial area signals supplied from the mode register circuit 23.

The A4 through A6 activating signals serve to determine which bits of the three upper-order bits A4 through A6 of the refresh address are taken into account when determining whether the refresh address is one of the addresses to be refreshed. All the A4 through A6 activating signals are set to HIGH when only one of the 8 blocks 51-1 through 51-8 is to be refreshed. Only two of the A4 through A6 activating signals are set to HIGH when only two of the 8 blocks 51-1 through 51-8 are to be refreshed. Only one of the A4 through A6 activating signals is set to HIGH when only four of the 8 blocks 51-1 through 51-8 are to be refreshed. All the A4 through A6 activating signals are set to LOW when all of the 8 blocks 51-1 through 51-8 are to be refreshed.

The A4 through A6 level selecting signals serve to specify a block to be refreshed by indicating a HIGH or LOW level with respect to each bit determined as a bit to be taken into account by the A4 through A6 activating signals. When only the block 51-1 for which (A4, A5, A6) is (L, L, L) is to be refreshed, the A4 through A6 activating signals are set to (H, H, H) to indicate that all the bits are to be taken into account, and the A4 through A6 selecting signals are set to (L, L, L). In this case, all the outputs of the NAND gates 42-1 through 42-3 are set to HIGH to cause the NOR gate 44 to produce a HIGH output only when the bits A4 through A6 of the refresh address are all set to LOW. In response, the refresh timing signal is output as the refresh request signal being in the asserting state via the NAND gate 45 and the inverter 46. The output of the NOR gate 44 described above corresponds to the mask signal shown in FIG. 4 and FIG. 5.

When only the block 51-7 for which (A4, A5, A6) is (L, H, H) and the block 51-8 for which (A4, A5, A6) is (H, H, H) are to be refreshed, the A4 through A6 activating signals are set to (L, H, H) to indicate that only the two upper-order bits are to be taken into account, and the A4 through A6 selecting signals are set to (x, H, H) (x: don't care). In this case, all the outputs of the NAND gates 42-1 through 42-3 are set to HIGH to cause the NOR gate 44 to produce a HIGH output only when the bits A5 and A6 of the refresh address are both set to HIGH. In response, the refresh timing signal is output as the refresh request signal being in the asserting state via the NAND gate 45 and the inverter 46.

As a further example, when only the blocks 51-1 through 51-4 for which A6 is L is to be refreshed, the A4 through A6 activating signals are set to (L, L, H) to indicate, that only the most significant bit is to be taken into account, and the A4 through A6 selecting signals are set to (x, x, L) (x: don't care). In this case, all the outputs of the NAND gates 42-1 through 42-3 are set to HIGH to cause the NOR gate 44 to produce a HIGH output only when the bit A6 of the refresh address is set to LOW. In response, the refresh timing signal is output as the refresh request signal being in the asserting state via the NAND gate 45 and the inverter 46.

As a yet further example, the A4 through A6 activating signals are set to (L, L, L), respectively, to cause none of the bits to be taken into account when all the blocks 51-1 through 51-8 are to be refreshed. In this case, all the outputs of the NAND gates 42-1 through 42-3 are set to HIGH regardless of the refresh address, thereby causing the NOR gate 44 to produce a HIGH output. In response, the refresh timing signal is output as the refresh request signal being in the asserting state via the NAND gate 45 and the inverter 46.

Figure 8:
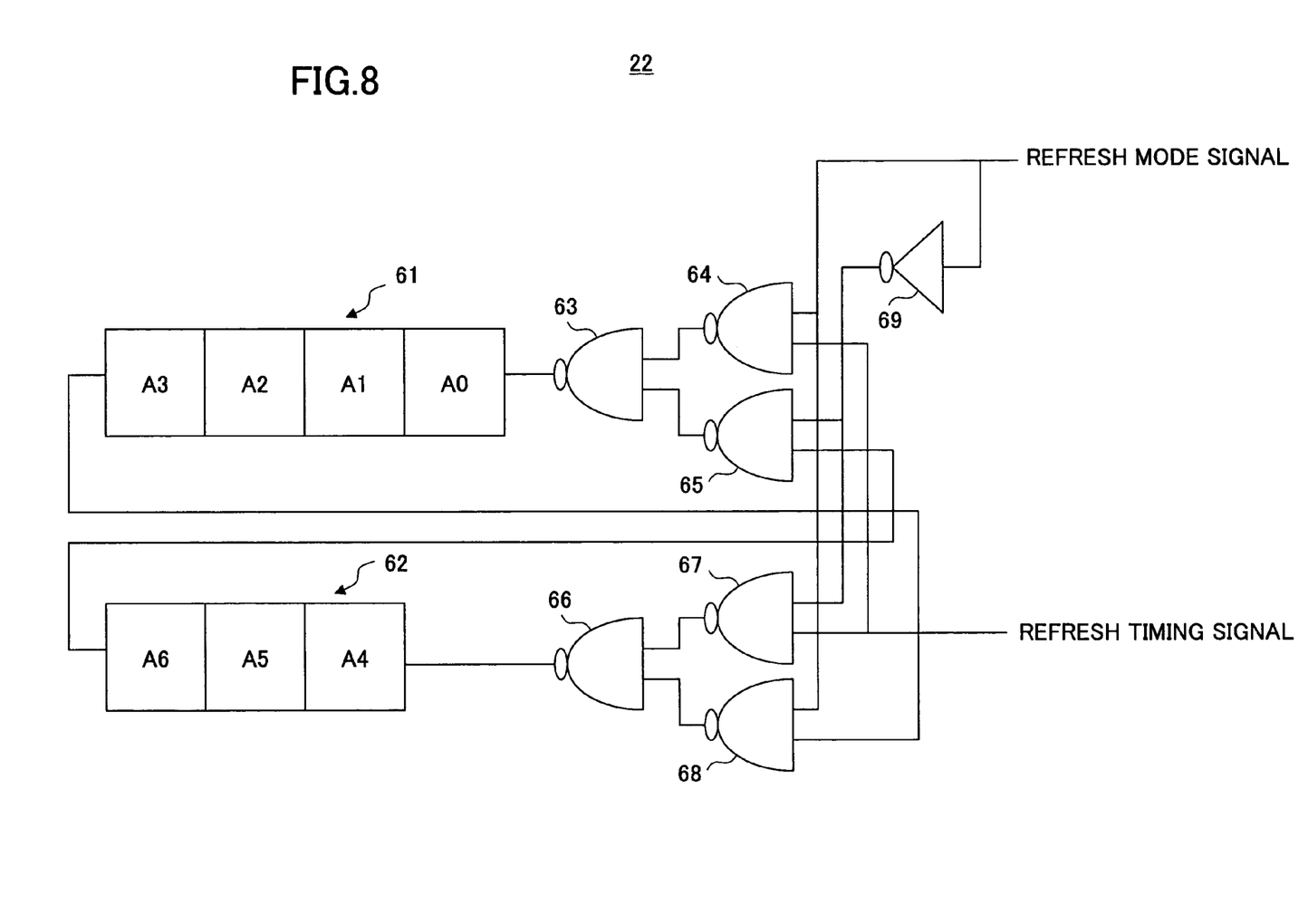
FIG. 8 is a drawing showing an example of the configuration of a refresh address counter.

FIG. 8 is a drawing showing an example of the configuration of the refresh address counter 22. The refresh address counter 22 includes a 4-bit counter 61, a 3-bit counter 62, NAND gates 63 through 68, and an inverter 69. The refresh address counter 22 receives the refresh mode signal from the mode register circuit 23 and the refresh timing signal from the refresh request signal generating circuit 21.

When the refresh mode signal is HIGH, the address advance pattern is such that the least significant bit A0 moves first, and a carry is added to a next higher bit in the following order: A0→A1→A2→A3→A4→A5→A6. Namely, the address advance pattern is such that the addresses increase in increments of one address. When the refresh mode signal is LOW, the address advance pattern is such that the third bit A4 from the most significant bit moves first, and a carry is added to a next higher bit in the following order: A4→A5→A6→A0→A1→A2→A3. Namely, the address advance pattern is such that the first refresh address is generated with respect to successive ones of the blocks 51-1 through 51-8 shown in FIG. 7, followed by generating the second refresh address with respect to successive ones of the blocks 51-1 through 51-8.

Specifically, when the refresh mode signal is HIGH, the NAND gate 64 allows the passage of the refresh timing signal whereas the NAND gate 67 does not allow the passage of the refresh timing signal. Accordingly, the 4-bit counter 61 counts up in synchronization with each pulse of the refresh timing signal. As the bit A3 changes in response to the counting-up operation of the 4-bit counter 61, such change propagates to the 3-bit counter 62 via the NAND gates 68 and 66. In this case, thus, the 4-bit counter 61 corresponds to the four lower-order bits, and the 3-bit counter 62 corresponds to the three higher-order bits.

When the refresh mode signal is LOW, the NAND gate 67 allows the passage of the refresh timing signal whereas the NAND gate 64 does not allow the passage of the refresh timing signal. Accordingly, the 3-bit counter 62 counts up in synchronization with each pulse of the refresh timing signal. As the bit A6 changes in response to the counting-up operation of the 3-bit counter 62, such change propagates to the 4-bit counter 61 via the NAND gates 65 and 63. In this case, thus, the 3-bit counter 62 corresponds to the three lower-order bits, and the 4-bit counter 61 corresponds to the four higher-order bits.

Figure 9:
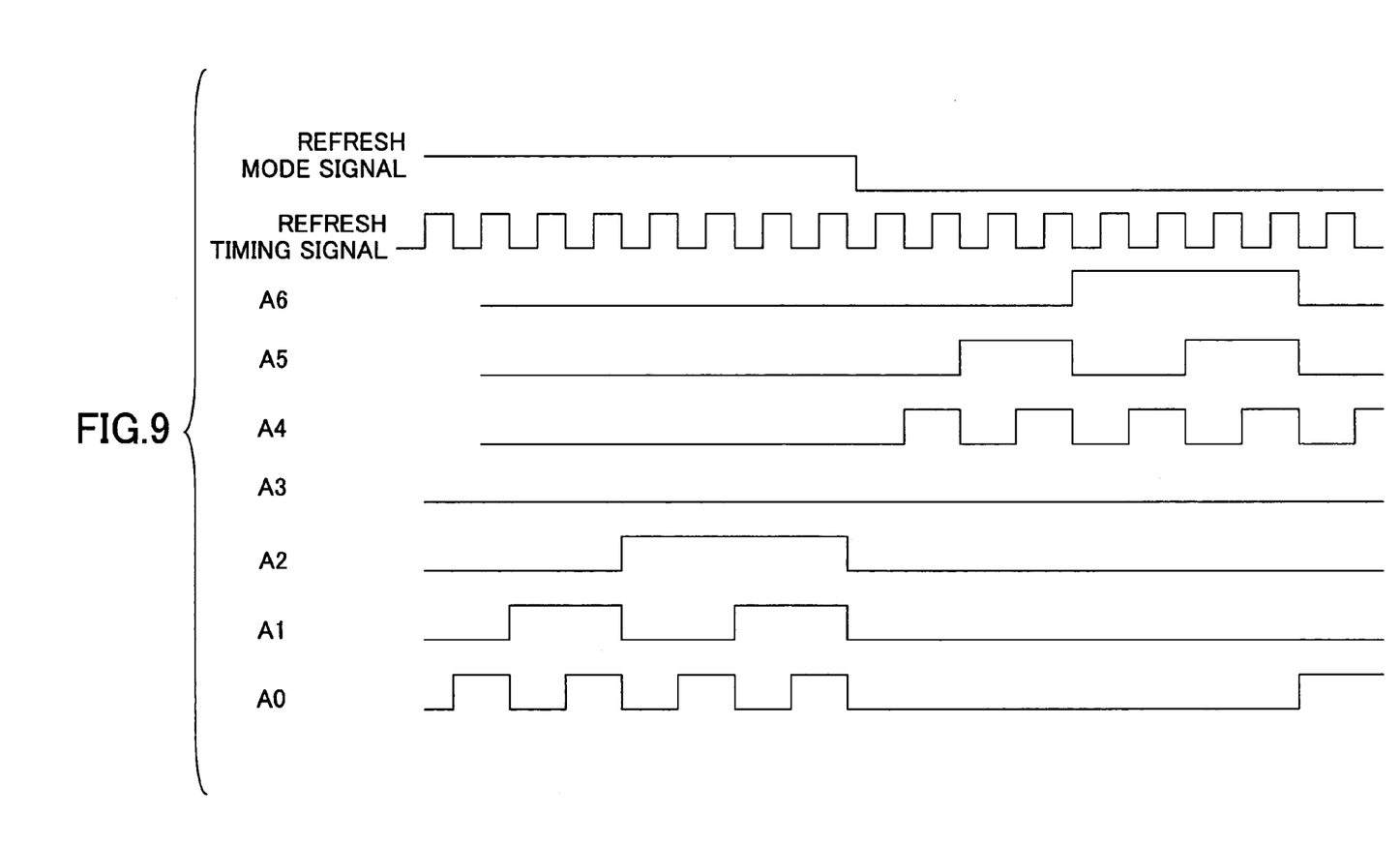
FIG. 9 is a drawing showing an example of the operation of the refresh address counter shown in FIG. 8.

FIG. 9 is a drawing showing an example of the operation of the refresh address counter 22 shown in FIG. 8. The refresh mode signal is shown at the top of FIG. 9. In FIG. 9, the refresh mode signal is HIGH at the beginning, and is then changed to LOW.

During the period in which the refresh mode signal is HIGH, the least significant bit A0 of the refresh address changes in synchronization with each pulse of the refresh timing signal. A1 changes in response to a falling edge of A0, A2 in response to a falling edge of A1, and A3 in response to a falling edge of A2. In the example shown in FIG. 9, however, the refresh mode signal is changed to LOW before A3 changes. In this manner, an address advance pattern in which the address increases one by one is achieved by changing the least significant bit of the refresh address first.

During the period in which the refresh mode signal is LOW, the third bit A4 from the most significant bit in the refresh address changes in synchronization with each pulse of the refresh timing signal. A5 changes in response to a falling edge of A4, A6 in response to a falling edge of A5, and A0 in response to a falling edge of A6. In this manner, the three upper-order bits A4 through A6 are changed first, so that the blocks 51-1 through 51-8 shown in FIG. 7, for example, can be successively selected in synchronization with each pulse of the refresh timing signal.

As described above, the semiconductor memory device 20 shown in FIG. 3 is configured such that the refresh address counter 22 successively generates refresh addresses in response to the refresh timing signal generated by the refresh request signal generating circuit 21, and the generated refresh addresses are supplied to the refresh request signal generating circuit 21 and the memory core circuit 24. The refresh request signal generating circuit 21 asserts the refresh request signal when the current refresh address indicated by the refresh address counter 22 is one of the addresses subjected to refresh. The refresh request signal generating circuit 21 negates the refresh request signal when the current refresh address indicated by the refresh address counter 22 is not one of the addresses subjected to refresh. In the case other than the partial refresh operation, i.e., in the case in which all the addresses are subjected to refresh in the memory core circuit 24, the refresh request signal generating circuit 21 asserts the refresh request signal with respect to all the refresh addresses.

The frequency of the refresh timing signal is set to a sufficiently fast frequency that is necessary to retain the data of all the addresses when all the refresh addresses are sequentially refreshed one by one. Regardless of whether in the case of the first refresh operation (corresponding to the refresh mode signal being LOW) shown in FIG. 4 in which refresh is performed intermittently by skipping the pulses of the refresh timing signal at predetermined intervals, or in the case of the second refresh operation (corresponding to the refresh mode signal being HIGH) shown in FIG. 5 in which refresh is continuously performed with respect to consecutive addresses without refreshing other addresses, a refresh address of interest is always refreshed at constant time intervals that are determined by the frequency of the refresh timing signal. Accordingly, no matter how the area subjected to refresh is changed, a refresh operation is never delayed with respect to a given refresh address Both the first refresh operation shown in FIG. 4 in which refresh is performed intermittently by skipping the pulses of the refresh timing signal at predetermined intervals and the second refresh operation shown in FIG. 5 in which refresh is performed by use of consecutive pulses of the refresh timing signal with respect to consecutive addresses without refreshing other addresses have their own advantages. In the case of the first refresh operation, each refresh operation is performed at constant intervals, so that the consumption of electric current by the refresh operations is evenly distributed in a time dimension. When plural time periods are considered, there is no large variation in the amount of electric current consumption between these periods. In the case of the second refresh operation, refresh operations are performed intensely during some period, and are not performed during another period, so that the consumption of electric current by the refresh operations largely varies in a time dimension. When plural time periods are considered, there is large variation in the amount of electric current consumption between these periods.

In DRAM, when word lines selected for refresh are consecutively positioned in the same memory array, signals such as a bit-line transfer signal that do not need to be changed are fixed so as to reduce current consumption during the refresh operation. With such configuration, it is preferable to refresh as many consecutive word lines as possible in the same memory array in order to reduce the total current amount. In this respect, thus, the second refresh operation described above that continuously refreshes consecutive addresses is preferable.

As far as a battery serving as a power supply in portable equipment is concerned, however, when the battery is used in a state in which the voltage is low due to a low charged amount, it is preferable to use the battery in such manner as to make the amount of current consumption evenly distribute in a time dimension by suppressing peak currents appearing as sudden flow of current, rather than to use the battery in a state in which the amount of electric current fluctuates with the occurrence of some large peak currents. Accordingly, it is preferable to use the first refresh operation having no large fluctuation in electric current consumption when the battery is used in a state in which the voltage is low due to a low charged amount. In the state in which the voltage is sufficiently high with sufficient charged amount, on the other hand, it is preferable to use the second refresh operation that can reduce the consumption of electric current during the refresh operation by fixing signals such as a bit-line transfer signal to a constant level.

Further, the second refresh operation has a problem in that since the amount of electric current largely fluctuates in a time dimension, a correct amount of electric current consumption cannot be measured when attempting to measure the amount of electric current necessary for refresh during the test phase of a semiconductor memory device. Accordingly, it is preferable to use the first refresh operation having no large fluctuation in electric current consumption when attempting to measure the amount of electric current necessary for refresh or the like.

For the reasons described above, the semiconductor memory device according to the present invention is provided with the first refresh operation in which refresh is performed intermittently by skipping the pulses of the refresh timing signal at predetermined intervals and the second refresh operation in which refresh is performed by use of consecutive pulses of the refresh timing signal with respect to consecutive addresses without refreshing other addresses, and switching between the first refresh operation and the second refresh operation is performed based on the setting of the mode register circuit 23 or the like. During the test phase of the semiconductor memory device, for example, a mode register setting corresponding to the LOW refresh mode signal is written to the mode register circuit 23. In response to this mode register setting, the mode register circuit 23 produces the LOW refresh mode signal, thereby achieving the first refresh operation for performing refresh at intermittent timing. During the test phase of the semiconductor memory device, thus, it becomes possible to easily measure the amount of electric current necessary for refresh.

Further, provision may be made such that the refresh mode is settable by use of the fuse circuit 35, so that a refresh mode signal responsive to the severed/intact state of the fuses of the fuse circuit 35 is supplied to the refresh address counter 22. In this case, the mode is fixed to a selected operation mode by fuse cutting at the time of shipment from the factory.

Figure 10:
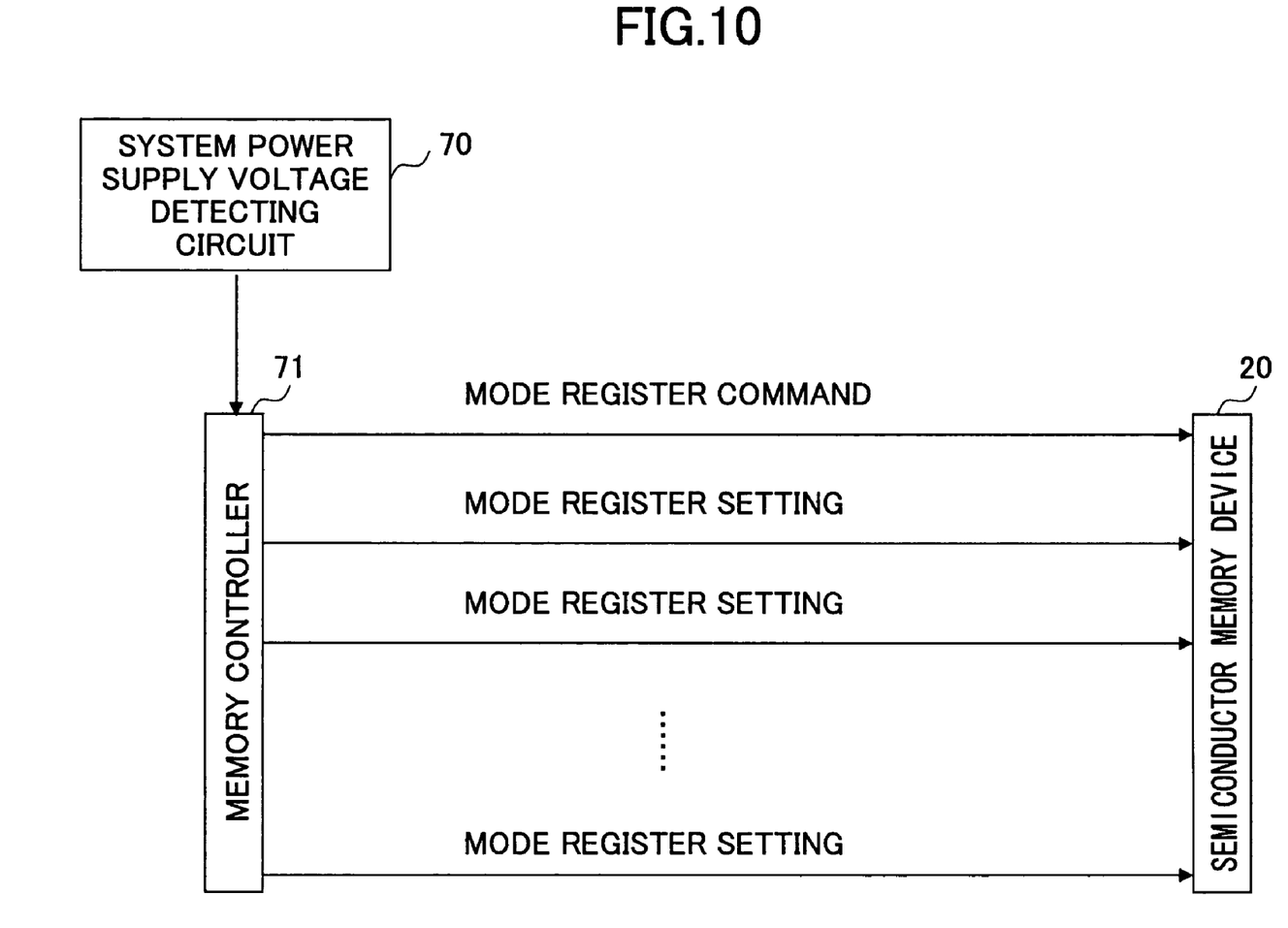
FIG. 10 is a drawing showing an example of the configuration of a memory system using the semiconductor memory device shown in FIG. 3.

FIG. 10 is a drawing showing an example of the configuration of a memory system using the semiconductor memory device 20 shown in FIG. 3. The memory system of FIG. 10 includes the semiconductor memory device (memory) 20, a system power supply voltage detecting circuit 70, and a memory controller 71.

The system power supply voltage detecting circuit 70 detects the power supply voltage of the semiconductor memory device 20. The system power supply voltage detecting circuit 70 asserts a detection signal to the memory controller 71 if the power supply voltage falls below a predetermined reference voltage. This may be done by using a comparator to compare the power supply voltage of the semiconductor memory device 20 with the predetermined reference voltage and by supplying the output of the comparator as the detection signal to the memory controller 71.

The memory controller 71 supplies a mode register command to the semiconductor memory device 20, and also supplies mode register settings to the semiconductor memory device 20 to make register settings with respect to the mode register circuit 23 of the semiconductor memory device 20. Namely, the supplied mode register settings are written to the mode register circuit 23.

When the detection signal from the system power supply voltage detecting circuit 70 is not asserted, the memory controller 71 supplies the mode register command to the semiconductor memory device 20 to write mode register settings corresponding to the HIGH refresh mode signal. In response to this mode register setting, the mode register circuit 23 produces the HIGH refresh mode signal, thereby achieving the second refresh operation for performing continuous refreshes with respect to consecutive addresses.

When the detection signal from the system power supply voltage detecting circuit 70 is asserted, the memory controller 71 supplies the mode register command to the semiconductor memory device 20 to write mode register settings corresponding to the LOW refresh mode signal. In response to this mode register setting, the mode register circuit 23 produces the LOW refresh mode signal, thereby achieving the first refresh operation for performing refresh at intermittent timing.

Further, the present invention is not limited to these embodiments, but various variations and modifications may be made without departing from the scope of the present invention.

What is claimed is:

1. A semiconductor memory device, comprising:
   a timing signal generating circuit configured to generate a refresh timing signal comprised of a series of pulses arranged at constant intervals;
   a refresh address generating circuit configured to generate a refresh address in synchronization with each pulse of the refresh timing signal;
   a pulse selecting circuit configured to assert a refresh request signal in synchronization with selected pulses selected from the series of pulses of the refresh timing signal; and
   a memory core circuit configured to receive the refresh address and the refresh request signal and to perform a refresh operation with respect to the refresh address in response to assertion of the refresh request signal,
   wherein arrangement is made to switch between a first operation mode in which the selected pulses are obtained by selecting one pulse out of every predetermined number of pulses from the series of pulses and a second operation mode in which the selected pulses are obtained by selecting consecutive pulses from the series of pulses.

2. The semiconductor memory device as claimed in claim 1, further comprising a mode register circuit configured to produce a refresh mode signal responsive to a register setting, wherein one of the first operation mode and the second operation mode is selected in response to the refresh mode signal.

3. The semiconductor memory device as claimed in claim 1, wherein the pulse selecting circuit is configured to receive the refresh timing signal and the refresh address, to select the selected pulses from the series of pulses of the refresh timing signal in response to the refresh address, and to assert the refresh request signal at timing of the selected pulses.

4. The semiconductor memory device as claimed in claim 3, wherein the pulse selecting circuit is configured to select a predetermined number of upper order bits from a plurality of bits constituting the refresh address and to select the selected pulses from the series of pulses of the refresh timing signal in response to values of the upper order bits.

5. The semiconductor memory device as claimed in claim 4, wherein the pulse selecting circuit is configured to select, as the selected pulses, pulses of the refresh timing signal at timing the upper order bits become a predetermined bit pattern.

6. The semiconductor memory device as claimed in claim 1, wherein the refresh address generating circuit is configured to generate the refresh address in accordance with a first address advance pattern in the first operation mode and to generate the refresh address in accordance with a second address advance pattern in the second operation mode.

7. The semiconductor memory device as claimed in claim 6, wherein the memory core circuit includes a plurality of blocks each including a plurality of word lines, and wherein two refresh addresses consecutively generated by the refresh address generating circuit in the first address advance pattern correspond to two different blocks, and two refresh addresses consecutively generated by the refresh address generating circuit in the second address advance pattern correspond to two adjacent word lines.

8. The semiconductor memory device as claimed in claim 6, wherein the refresh address generating circuit includes:
   a first counter corresponding to upper order bits of the refresh address; and
   a second counter corresponding to lower order bits of the refresh address,
   wherein the refresh address generating circuit is configured such that one of the first counter and the second counter performs a counting operation in synchronization with each pulse of the refresh timing signal.

9. A memory system, comprising:
   a memory;
   a power supply voltage detecting circuit configured to detect a voltage level of a power supply voltage of the memory; and
   a controller configured to control the memory in response to the voltage level detected by the power supply voltage detecting circuit,
   wherein the memory includes:
   a timing signal generating circuit configured to generate a refresh timing signal comprised of a series of pulses arranged at constant intervals;
   a refresh address generating circuit configured to generate a refresh address in synchronization with each pulse of the refresh timing signal;
   a pulse selecting circuit configured to assert a refresh request signal in synchronization with selected pulses selected from the series of pulses of the refresh timing signal; and a memory core circuit configured to receive the refresh address and the refresh request signal and to perform a refresh operation with respect to the refresh address in response to assertion of the refresh request signal, wherein arrangement is made to switch between a first operation mode in which the selected pulses are obtained by selecting one pulse out of every predetermined number of pulses from the series of pulses and a second operation mode in which the selected pulses are obtained by selecting consecutive pulses from the series of pulses, and the memory controller is configured to select one of the first operation mode and the second operation mode in response to the detected voltage level and to cause the memory to operate in the selected operation mode.

10. The memory system as claimed in claim 9, wherein the memory controller is configured to select the second operation mode in response to the detected voltage level higher than a predetermined voltage level and to select the first operation mode in response to the detected voltage level lower than the predetermined voltage level.

* * * * *